(12) United States Patent
Merchant et al.

(10) Patent No.: US 6,313,021 B1
(45) Date of Patent: Nov. 6, 2001

(54) PMOS DEVICE HAVING A LAYERED SILICON GATE FOR IMPROVED SILICIDE INTEGRITY AND ENHANCED BORON PENETRATION RESISTANCE

(75) Inventors: Sailesh M. Merchant; Joseph R. Radosevich; Pradip K. Roy, all of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/416,491

(22) Filed: Oct. 12, 1999

Related U.S. Application Data
(60) Provisional application No. 60/116,122, filed on Jan. 15, 1999.

(51) Int. Cl.[7] .................. H01L 21/3205; H01L 21/4763
(52) U.S. Cl. ....................... 438/592; 438/593; 438/647
(58) Field of Search .................... 438/151, 197, 438/199, 233, 283, 305, 585, 592, 593, 647

(56) References Cited

U.S. PATENT DOCUMENTS

| 4,742,020 | 5/1988 | Roy | 437/61 |
|---|---|---|---|
| 4,782,033 | * 11/1988 | Gierisch et al. | 437/56 |
| 5,147,820 | 9/1992 | Chittipeddi et al. | 437/193 |
| 5,298,436 | 3/1994 | Radosevich et al. | 437/29 |
| 6,093,589 | * 7/2000 | Lo et al. | 438/197 |
| 6,114,736 | * 9/2000 | Balasubramanyam et al. | 257/412 |
| 6,162,716 | * 12/2000 | Yu et al. | 438/592 |
| 6,194,294 | * 2/2001 | Lee | 438/585 |

* cited by examiner

*Primary Examiner*—John F. Niebling
*Assistant Examiner*—Walter L. Lindsay, Jr.

(57) ABSTRACT

The present invention provides a process for forming a sub-micron p-type metal oxide semiconductor (PMOS) structure on a semiconductor substrate. The process includes forming a gate oxide on the semiconductor substrate, forming a gate layer on the gate oxide by depositing a first gate layer on the gate oxide at a first deposition rate and depositing a second gate layer on the first layer at a second deposition rate to provide an improved stress accommodation within the gate structure. The process further includes forming a silicide dopant barrier on the gate. Due to the presence of the improved stress accommodation in the gate, the integrity of the silicide dopant barrier is substantially enhanced. This increased silicide integrity prevents significant damage to the silicide dopant barrier layer during subsequent fabrication processes. As such, the dopant barrier is able to provide the intended degree of resistance to dopant penetration, for example boron, during the formation of source and drain regions adjacent the gate structure.

13 Claims, 2 Drawing Sheets

US 6,313,021 B1

PMOS DEVICE HAVING A LAYERED SILICON GATE FOR IMPROVED SILICIDE INTEGRITY AND ENHANCED BORON PENETRATION RESISTANCE

CROSS-REFERENCE TO RELATED APPLICATION

This Application claims the benefit of U.S. Provisional Application Ser. No. 60/116,122, filed on Jan. 15, 1999, and entitled "PMOS DEVICE HAVING A LAYERED SILICON GATE FOR IMPROVED SILICIDE INTEGRITY AND ENHANCED BORON PENETRATION RESISTANCE", commonly assigned with the present invention and incorporated herein by reference.

TECHNICAL FIELD OF THE INVENTION

The present invention is directed, in general, to a device and process for the fabrication of sub-micron p-channel MOS (PMOS) devices and more specifically, to a process for forming a layered silicon gate that improves silicide integrity and substantially prevents boron penetration during a doping process.

BACKGROUND OF THE INVENTION

As is well known, transistors in semiconductor devices are commonly constructed on silicon wafers using a chemical vapor deposition (CVD) process along with many other process steps. Individual transistor components are fabricated on a wafer using conventional deposition and etching techniques. Components are formed over either n-tub or p-tub regions in the silicon substrate. The individual transistor regions are then doped with either an n-type or p-type dopant according to the desired type of semiconductor device.

In p-channel metal oxide semiconductor (PMOS) devices, boron is typically the p+dopant that is implanted into the source/drain regions. However, during this phase of the manufacturing step, heavily doped boron in the polysilicon gate has a tendency to diffuse laterally around the gate or transversely through the gate and into the p-channel areas of the device. This diffusion often leads to severe threshold voltage instablilities and reliability problems in the PMOS device.

To minimize the diffusion of these dopants, a barrier layer is typically formed over the polysilicon gate. In many instances, the barrier layer may comprise a tungsten nitride, a tungsten silicide nitride or a titanium-nitride (TiN). The titanium-nitride has problems associated with its use because it oxidizes at ambient temperatures making it prone to oxidation problems. Furthermore, titanium-nitride cannot withstand the high temperatures of certain subsequent processing steps, such as source/drain annealing, which typically occurs around 900° C. to 1000° C.; thus, it cannot be used in deposition schemes in which these temperatures are encountered. While tungsten-based silicides can withstand high temperature anneals, a problem arises with their use when they are used with conventional gate deposition process, as explained below.

As the size of gate devices has reached the sub-micron range (i.e., 0.25 microns or less), the integrity of the junction or interface between the polysilicon gate structure and the silicide barrier layer has become an issue. In conventional processes, polysilicon or amorphous silicon is typically used to form the gate structure, which is subsequently overlayed with a metal-based barrier layer, such as tungsten nitride or tungsten silicide nitride. This barrier layer/gate structure formation is typically followed by a high temperature anneal of some type. During this anneal, the silicide integrity at the junction/interface between the polysilicon gate and the silicide barrier layer becomes corrupt, which often leads to leakage, and thus, penetration of the boron dopant through the gate structure and into the p-channel. This problem is even more acute where the gate structure is initially formed from amorphous silicon.

As well known, amorphous silicon re-crystallizes into polysilicon in the presence of annealing temperatures in excess of 500° C. In such instances, re-crystallization can cause abnormal grain growth, which in turn, corrupts the silicide integrity and allows the dopant to penetrate into the p-channel.

Accordingly, what is needed in the art is a process that provides for a gate structure that can withstand annealing temperatures such that suppression of dopant penetration, both lateral and transverse, occurs with a simultaneous improvement of the silicide integrity.

SUMMARY OF THE INVENTION

To address the above-discussed deficiencies of the prior art, the present invention provides a process for forming a sub-micron p-type metal oxide semiconductor (PMOS) structure on a semiconductor substrate. In one advantageous embodiment, the process includes forming a gate oxide on the semiconductor substrate, forming a gate layer on the gate oxide by depositing a first gate layer on the gate oxide at a first deposition rate and depositing a second gate layer on the first layer at a second deposition rate. Preferably, the gate is formed to a width of about 0.25 microns or less and to a thickness of about 100 nm. Of course, it is readily apparent that the present invention could also includes more than two layers. In fact, it is believed that overall structural integrity of the gate is further enhanced by adding additional layers with differing deposition rates. It is believed that the oscillation of the deposition rate provides an improved stress accommodation within the gate structure. The process further includes forming a silicide dopant barrier on the gate. Due to the presence of the improved stress accommodation in the gate, the integrity of the silicide dopant barrier is substantially enhanced. This increased silicide integrity prevents significant damage to the silicide dopant barrier layer during subsequent fabrication processes. As such, the dopant barrier is able to provide the intended degree of resistance to dopant penetration, for example boron, during the formation of source and drain regions adjacent the gate structure.

Thus, the present invention is directed to a process that provides suppression of dopant penetration, both lateral and transverse, with a simultaneous improvement of silicide integrity in PMOS gate structures.

In one embodiment, forming the dopant barrier includes forming a tungsten nitride barrier and in another embodiment, forming the dopant barrier includes forming a tungsten silicide nitride barrier.

In an particularly advantageous embodiment, forming a first gate layer includes forming the first gate layer at a first deposition rate ranging from about 1 nm to about 1.5 nm per minute and forming a second gate layer includes forming the second gate layer at a second deposition rate ranging from about 3 nm to about 5 nm per minute. It is believed that this perturbation in the deposition rate provides improved stress accommodation, which in turn enhances or improve the integrity of the silicide dopant barrier.

The structure may be formed by depositing first and second layers of polysilicon. In such embodiments, the first and second polysilicon layers are formed from a low pressure chemical vapor deposition of silane at a temperature of about 600° C. and at a pressure ranging from about 0.25 torr to about 0.5 torr. Again, it is believed that the perturbation formed by oscillating the deposition rate of the first and second layers provides a more uniform grain size, which provides the improved integrity of the silicide dopant barrier.

In an alternative embodiment, forming the first and second gate layers includes forming first and second gate layers from amorphous silicon. In this particular embodiment, the first and second amorphous layers are formed at a temperature less than about 550° C. at a pressure ranging from about 0.25 torr to about 0.5 torr and subjecting the first and second amorphous silicon layers to a temperature of about 600° C. to re-crystalize the amorphous silicon into a polysilicon have an enhanced uniform grain size and distribution. It is believed that this enhanced uniform grain size and distribution provides an improved silicide dopant barrier integrity.

In another embodiment, the process further includes subjecting the PMOS structure to a high temperature anneal having a temperature that ranges from about 900° C. to about 1000° C. This anneal is conducted subsequent to the formation of the silicide dopant barrier and is typically used to diffuse the boron dopant into the source and drain regions adjacent the gate. In yet another embodiment, the process may include forming an n-type metal oxide semiconductor (NMOS) structure adjacent the PMOS device.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
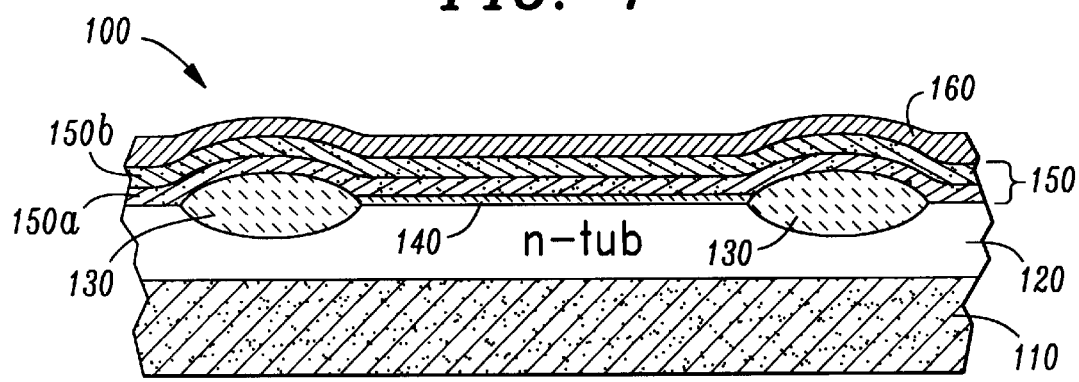
FIG. 1 illustrates a sectional view of an improved p-channel MOS device constructed according to principles of the present invention at an intermediate stage of manufacture.

Referring initially to FIG. 1, illustrated is a sectional view of an improved p-channel MOS device constructed according to principles of the present invention at an intermediate stage of manufacture. At this stage, an improved p-channel MOS device, generally designated 100, comprises a silicon substrate 110, an n-tub region 120, field oxide regions 130, a gate oxide layer 140, a stacked polysilicon or amorphous (poly/αSi) gate layer 150, and a silicide dopant barrier layer 160. While a silicide dopant barrier is specifically discussed herein, it should be specifically understood that the silicide dopant barrier may include a salicide dopant barrier. The silicon substrate 110, n-tub region 120, field oxide regions 130, and gate oxide layer 140 are formed by conventional processes.

In the embodiment illustrated in FIG. 1, the poly/αSi gate layer 150 comprises a multi-layer structure wherein each sub-layer is deposited by using varying rates of deposition that may range from about 1 nm per minute to about 10 nm per minute, and the deposition rate may also be varied by varying other deposition parameters such as gas flow, pressures and temperatures. The design gate width is in the sub-micron range, e.g., 0.25 microns or less, because boron dopant penetration is of particular issue in these gate sizes. Additionally, the overall thickness of the gate layer 150 will typically be 100 nm or less. For example, in the illustrated embodiment, the poly/αSi gate layer 150 comprises sub-layers 150a and 150b. Layer 150a may be polysilicon that is deposited using a first deposition rate that can range from about 1 nm per minute to about 1.5 nm per minute. The deposition is preferably achieved from low pressure chemical vapor deposition (LPCVD) pyrolysis of silane at 600° C. and at a pressure that ranges from about 0.25 torr to about 0.5 torr. Layer 150b is then deposited over layer 150a using a second deposition rate that may range from about 3 nm per minute to about 5 nm per minute. It should be noted that the dopant concentration within the gate structure 150 is substantially constant throughout the sub-layers 150a and 150b. The gate layer 150 is doped using conventional gate doping processes. It is believed that this oscillation in the deposition rate for each of the polysilicon layers 150a and 150b produces a stacked structure that provides overall enhanced stress accommodation. In the case where the gate layer is polysilicon, it is believed that the enhanced stress accommodation is attributable to the more uniform grain growth and grain distribution that results from oscillating the deposition rate between the sublayers.

In an alternative embodiment, the gate layer 150 may initally comprise amorphous silicon (αSi). In such embodiments, the sub-layer 150a is deposited at a rate that may range from about 1 nm per minute to about 1.5 nm per minute and the sub-layer 150b is deposited at a rate that may range from about 3 nm per minute to about 5 nm per minute. The deposition of the αSi is preferably achieved from low pressure chemical vapor deposition (LPCVD) pyrolysis of silane at 550° C. and at a pressure that ranges from about 0.25 torr to about 0.5 torr. This variation in deposition rate forms a polycrystalline silicon layer with a more uniform grain size and distribution after the gate layer 150 is annealed at a higher temperature, which provides enhanced stress accommodation. As previously mentioned, the su-layer scheme for the poly/αSi gate layer may be carried out for multiple layers. In fact, it is believed that stress accommodation and microstructural control (i.e., grain size uniformity and distribution) improves with the number of sub-layers. Thus, multiple sub-layers can be added up to the limits of design parameters, if so desired.

The desired effect of preventing penetration of boron p+ ions through the gate layer 150 is achieved by depositing the silicide layer 160 over the poly/αSi gate layer 150. The silicide layer 160 is deposited using conventional deposition processes and may comprise a tungsten silicide or a tungsten silicide nitride. As previously mentioned, titanium nitride is far less desirable that the tungsten-based suicides because titanium nitride is not able to withstand the high temperature anneals in subsequent deposition steps. The silicide layer 160 forms a junction or interface with the top surface of the gate layer 150, and it is the integrity of this junction that benefits from the improved stress accommodation associated with the above-described deposition process. In conventional gate devices, which lack the improved stress accommodation of the present invention, the junction integrity of the silicide barrier layer 160 can be lost in post deposition, high temperature anneals, such as those that occur around 900° C. to 1000° C. during the formation of the source and drain regions adjacent the gate. When the silicide barrier layer's integrity is lost or corrupted by these high temperature anneals, the silicide barrier layer is susceptible to both transverse and lateral dopant leakage, which allows the boron dopant to penetrate into the p-channel, thereby possibly causing severe threshold voltage instablilities and reliability problems in the PMOS device.

Figure 2:
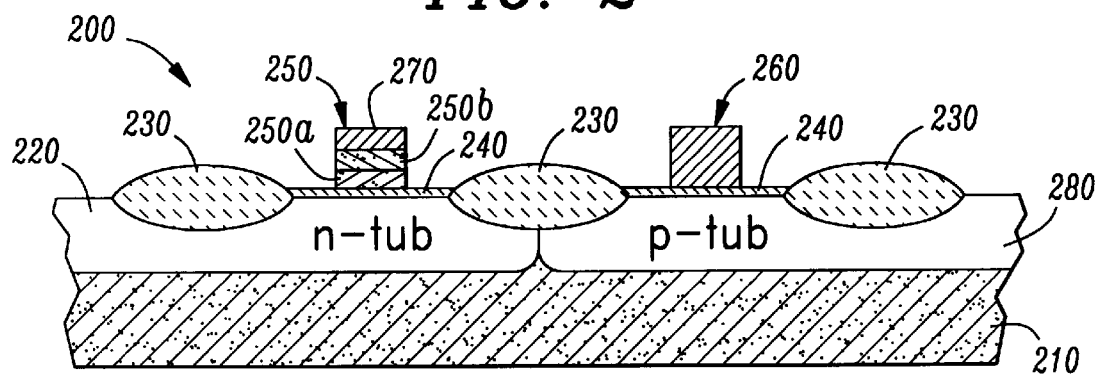
FIG. 2 illustrates a sectional view of one embodiment of a CMOS device constructed according to principles of the present invention at an intermediate stage of manufacture.

Referring now to FIG. 2, illustrated is a sectional view of one embodiment of a CMOS device constructed according to principles of the present invention at an intermediate stage of manufacture, subsequent to a conventional etching process, which forms the gate structures. A CMOS device, generally designated 200, comprises a silicon substrate 210, an n-tub region 220, field oxide regions 230, and a gate oxide layer 240. A silicon gate 250 is formed over the n-tub region 220 and comprises the sub-layers 250a and 250b as formed by the deposition processes discussed above. The silicon gate 250 further includes a silicide dopant barrier 270 formed on sub-layer 250b. Adjacent the silicon gate 250 is another silicon gate 260 that is formed over the p-tub region 280. The gate 250 is located over the n-tub region 220, which forms a PMOS device, and the other gate 260 is located over the p-tub region 280, which forms an NMOS device. The gates 250,260 are formed on the gate oxide layer 240 using conventional methods of masking and etching necessary to remove excess material from the gates 250, 260. The illustration depicts the device prior to dopant implantation.

The gate 250 located over the n-tub region 220 has been formed with the silicide dopant barrier layer 270 to prevent dopant diffusion into the area of the n-tub region 220 below the gate 250. However, the silicide dopant barrier layer 270 is not present in the gate 260 located over the p-tub region 280. The absence is because the physical and electrical characteristics of the NMOS device do not necessitate preventing p+ boron dopant diffusion.

Figure 3:
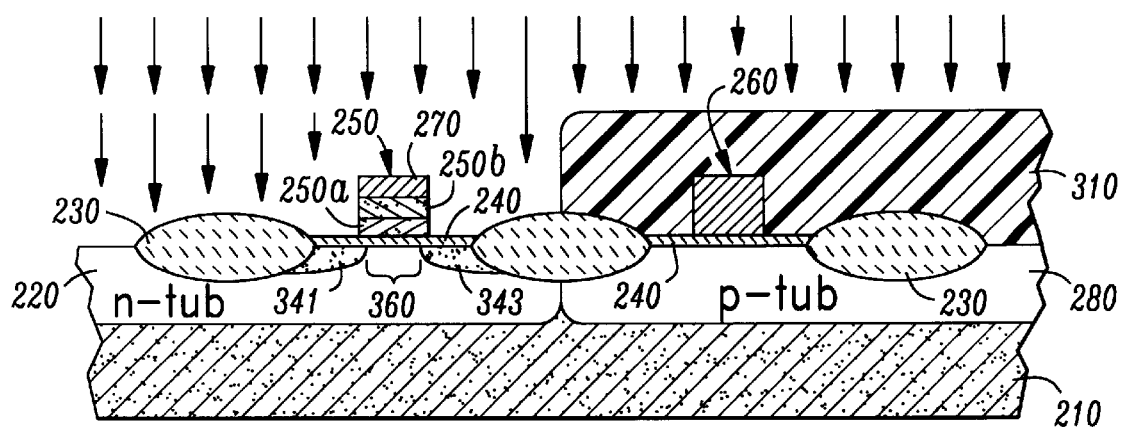
FIG. 3 illustrates a sectional view of the semiconductor device of FIG. 2 after the implantation of dopant to the n-tub region.

Referring now to FIG. 3, illustrated is a sectional view of the semiconductor device of FIG. 2 during the implantation of a dopant to the n-tub region. A photo resist mask 310 has been applied over the p-tub region 280 to prevent unwanted dopant contamination during the formation of source and drain regions in the n-tub region 220. Boron p+ dopant is applied to the semiconductor device 200 by conventional CVD or ion implantation methods and diffuses through the gate oxide layer 240 to form a source 341 and a drain 343. Dopant consequently also diffuses into the gate 250. However, the dopant barrier layer 270 prevents the dopant from diffusing through the gate 250 and into a p-channel area 360 of the semiconductor device 200. Without the dopant barrier layer 270, the likelihood that dopant would diffuse into the p-channel area 360 of the device 200 and result in punchthrough is increased. However, with the silicide dopant barrier layer 270 in place and its integrity enhanced due to the stress accommodation associated with the gate 250, punchthrough is substantially decreased, if not eliminated entirely.

Figure 4:
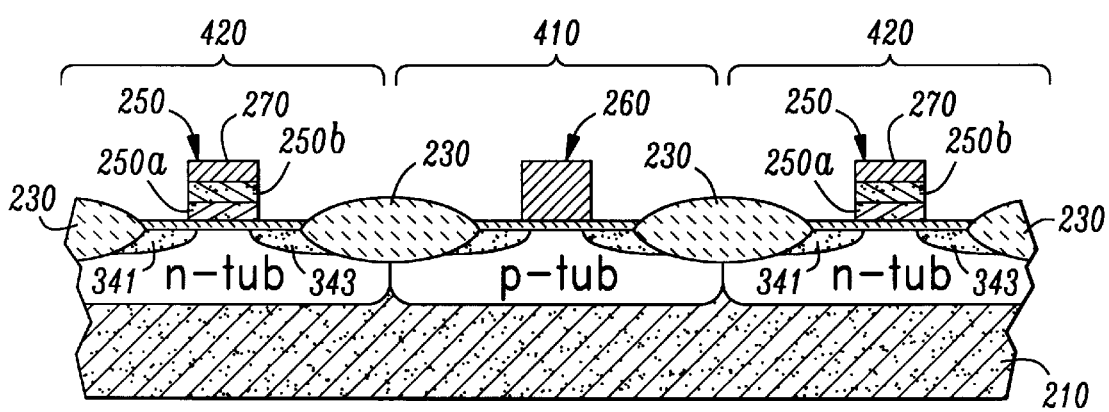
FIG. 4 illustrates a sectional view of a CMOS device comprising both NMOS and PMOS devices.

Referring now to FIG. 4, illustrated is a sectional view of a dual gate CMOS device comprising a plurality of both NMOS 410 and PMOS 420 devices. This particular figure simply illustrates that the present invention can be used to form a silicide dopant barrier layer in a plurality of PMOS devices simultaneously by conventional masking and doping processes. It should be understood that the present invention may also be applicable to other technologies wherein boron penetration is an issue, such as BiCMOS devices.

From the foregoing, it is readily apparent that the present invention the present invention provides a process for forming a sub-micron p-type metal oxide semiconductor (PMOS) structure on a semiconductor substrate. The process includes forming a gate oxide on the semiconductor substrate, forming a gate layer on the gate oxide by depositing a first gate layer on the gate oxide at a first deposition rate and depositing a second gate layer on the first layer at a second deposition rate. The process further includes forming a silicide dopant barrier on the gate. Due to the presence of the improved stress accommodation in the gate, the integrity of the silicide dopant barrier is substantially enhanced. This increased silicide integrity prevents significant damage to the silicide dopant barrier layer during subsequent fabrication processes. As such, the dopant barrier is able to provide the intended degree of resistance to dopant penetration, for example boron, during the formation of source and drain regions adjacent the gate structure. Thus, the present invention provides suppression of dopant penetration, both lateral and transverse, with a simultaneous improvement of silicide integrity in PMOS gate structures.

Although the present invention has been described in detail, those skilled in the art should understand that they can make various changes, substitutions and alterations herein without departing from the spirit and scope of the invention in its broadest form.

What is claimed is:

1. A process of forming a sub-micron PMOS structure on a semiconductor substrate, comprising:

forming a gate oxide on said semiconductor substrate;

forming a gate on said gate oxide by depositing a first gate layer on said gate oxide at a first deposition rate and depositing a second gate layer on said first layer at a second deposition rate to provide an improved stress accommodation within said gate, said first and second gate layers having substantially a same dopant concentration; and forming a silicide dopant barrier on said gate, said improved stress accommodation substantially improving an integrity of said silicide dopant barrier, thereby to suppress a dopant penetration through said gate structure.

2. The process as recited in claim 1 wherein forming a silicide dopant barrier includes forming a silicide dopant barrier that substantially inhibits a diffusion of boron therethrough.

3. The process as recited in claim 2 wherein forming a silicide dopant barrier layer includes forming a tungsten silicide nitride barrier layer.

4. The process as recited in claim 2 wherein forming a silicide dopant barrier layer includes forming a tungsten nitride barrier layer.

5. The process as recited in claim 1 wherein forming first gate layer includes forming said first gate layer at a first deposition rate ranging from about 1 nm to 1.5 nm per minute and forming said second gate layer includes forming said second gate layer at a second deposition rate ranging from about 3 nm to 5 nm per minute.

6. The process as recited in claim 1 wherein forming first and second gate layers include forming first and second polysilicon layers.

7. The process as recited in claim 6 wherein forming first and second polysilicon layers include forming first and second polysilicon layers from a low pressure chemical vapor deposition of silane at a temperature of about 600° C. and at a pressure ranging from about 0.25 torr to about 0.5 torr.

8. The process as recited in claim 1 wherein forming first and second gate layers include initially forming first and second amorphous silicon layers.

9. The process as recited in claim 8 wherein forming first and second amorphous silicon layers include forming first and second amorphous silicon layers at a temperature less than about 550° C. at a pressure ranging from about 0.25 torr to about 0.5 torr and subjecting said first and second amorphous silicon layers to a temperature of about 600° C.

10. The process as recited in claim 1 further including subjecting said PMOS structure to a high temperature anneal ranging from about 900° C. to about 1000° C., subsequent to forming said silicide dopant barrier on said gate.

11. The process as recited in claim 1 wherein forming a gate includes forming a gate to a width of about 0.25 microns or less and to a thickness of less than about 100 nm.

12. The process as recited in claim 1 further comprising forming an NMOS structure adjacent said PMOS structure.

13. The process as recited in claim 1 further comprising forming source and drain regions in said semiconductor substrate adjacent said gate with boron dopant.

* * * * *